(12) United States Patent
Kurosawa

(10) Patent No.: US 8,283,842 B2
(45) Date of Patent: Oct. 9, 2012

(54) LED LIGHTING APPARATUS

(75) Inventor: Hideyuki Kurosawa, Chiba (JP)

(73) Assignee: Swan-Lite Manufacturing Co., Ltd., Chiba (JP)

( * ) Notice: Subject to any disclaimer, the term of this patent is extended or adjusted under 35 U.S.C. 154(b) by 34 days.

(21) Appl. No.: 12/996,895

(22) PCT Filed: Jun. 10, 2008

(86) PCT No.: PCT/JP2008/060580
§ 371 (c)(1),
(2), (4) Date: Dec. 8, 2010

(87) PCT Pub. No.: WO2009/150711
PCT Pub. Date: Dec. 17, 2009

(65) Prior Publication Data
US 2011/0163649 A1    Jul. 7, 2011

(51) Int. Cl.
*H01L 33/00*    (2010.01)
*F21V 29/00*    (2006.01)
(52) U.S. Cl. .............................. 313/45; 313/46; 362/294
(58) Field of Classification Search ................... 313/512, 313/498, 45–46; 362/294
See application file for complete search history.

(56) References Cited

U.S. PATENT DOCUMENTS
7,586,127 B2 *  9/2009  Nomura et al. ................. 257/89

FOREIGN PATENT DOCUMENTS
| EP | 2078736 A1 | * | 7/2009 |
| JP | 2006-179443 A | | 6/2006 |
| JP | 3965929 B | | 6/2007 |
| JP | 2007201405 A | * | 8/2007 |

* cited by examiner

*Primary Examiner* — Karabi Guharay
(74) *Attorney, Agent, or Firm* — Cozen O'Connor

(57) ABSTRACT

An object is to provide a lighting apparatus the cost of which is low, which is excellent in terms of heat dissipation capacity, and which does not make a human get burned even in the case where the human directly touches the lighting apparatus.
An LED substrate unit (1) is mounted on a metal heat conduction plate (3) with high heat conductivity. Resin heat radiation plates (4, 5) with high thermal emittance and low heat conductivity are adhered to the entire exposure surface of both surfaces of the heat conduction plate (3) except for a portion on which the LED substrate unit (1) is mounted. Thus, a three layer structure is formed of the heat conduction plate and the heat radiation plates provided on both surfaces of the heat conduction plate. Heat discharged from the LED substrate unit (1) is diffused in the heat conduction plate (3) and transmitted to the resin heat radiation plates (4, 5), and the transmitted heat is discharged from the resin heat radiation plates (4, 5) to outer air.

4 Claims, 2 Drawing Sheets

LED LIGHTING APPARATUS

TECHNICAL FIELD

The present invention relates to a lighting apparatus utilizing an LED as a light source.

BACKGROUND ART

There has been conventionally known the use of an LED substrate unit as energy-saving illumination which consumes less energy than other light sources.

Moreover, the LED substrate unit has been highly expected as a light source for a thin lighting apparatus excellent in design since it is smaller in size than other light sources for an incandescent lamp or a fluorescent lamp.

However, when the LED substrate unit emits light, considerably high heat is generated. If a temperature of an LED is increased due to the generated heat, conversion efficiency from electric energy into optical energy is degraded. As a result, it is impossible to make full use of the feature of a low energy consumption of the LED, and further, to prolong the lifetime of the LED.

In order to solve the above-described problems, a lighting apparatus disclosed in Patent Document 1 has been known in the related art. This conventional lighting apparatus is designed such that an LED-packaged substrate is incorporated directly in a pair of aluminum casings. This is for improving heat dissipation capacity by making full use of the characteristics of highly heat conductive aluminum. In addition, some contrivance has been taken for further improving the heat dissipation effect via a ventilation hole or a cutout by forming the ventilation hole or the cutout in the casing or LED-packaged substrate.

Patent Document 1: Japanese Patent Application Laid-Open No. 2006-179443

Patent Document 2: Japanese Patent No. 3965929

DISCLOSURE OF INVENTION

Problems to be Solved by the Invention

The above-described conventional lighting apparatus has raised the problem that it cannot effectively dissipate heat as the lighting apparatus because of the limited heat dissipation effect of aluminum.

Additionally, aluminum constituting the casing has a high heat conductivity, and therefore, if a hand touches directly the aluminum having a high temperature, the high heat is continuously supplied to a portion from which heat is dissipated by the touch of the hand. As a result, if a user touches the aluminum directly, the user feels hot compared to touching something having a low heat conductivity. Therefore, there has been a problem that the heat gives an unpleasant feeling to the user.

Incidentally, Patent Document 1 discloses that the casing may be made of a resin. Indeed, when the casing is made of a resin, the user does not feel so hot even if the user touches the casing directly, unlike the aluminum die cast casing.

However, the resin is excellent in heat radiation but not in heat conductivity. Therefore, the heat generated when the LED emits light is hardly transmitted over the entire surface of the casing, thereby raising a problem of poor heat dissipation accordingly.

On the other hand, it is considered that while the casing is made of a resin, an aluminum LED-packaged substrate having an area in contact with the entire inner surface of the casing may be used. In this manner, when the LED-packaged substrate is formed of an aluminum plate having a high heat conductivity, heat at the time of light emission from the LED can be quickly diffused over the entire surface of the casing, so that the heat can be efficiently radiated via the resin casing.

However, if the LED-packaged substrate has also the function of heat diffusion as described above, the LED-packaged substrate needs to have almost the same size as the resin casing. This is because the LED-packaged substrate made of aluminum needs to be brought into close contact with the entire surface of the casing in order to efficiently transmit the heat generated at the time of the LED emission over the entire surface of the resin casing. In this manner, the size or shape of the aluminum plate needs to be varied according to the size or shape of the casing such that the LED-packaged substrate is brought into close contact with the entire surface of the casing.

In addition, in the case where a large aluminum plate is used as the LED-packaged substrate, the aluminum plate needs to be subjected to insulation as well as special processing as an electric circuit in order to mount an LED on a substrate. However, a commercially available LED-packaged substrate at present is not so large. Furthermore, only a customized large LED-packaged substrate can be subjected to the electric processing according to the casing, thereby raising a problem of an increase in manufacturing cost.

In view of the above, an object of the present invention is to provide a lighting apparatus capable of efficiently dissipating heat even at reduced cost and preventing any burn upon direct touch by a person.

Means For Solving The Problems

A lighting apparatus according to a first aspect is featured by having a three-layered structure including a metallic heat conduction plate having a high heat conductivity and including an LED substrate unit, and resin heat radiation plates having a high thermal emittance and a low heat conductivity and brought into close contact with both surfaces of the heat conduction plate and over the exposed surfaces except a portion where the LED substrate unit is attached, wherein heat radiated from the LED substrate unit is diffused inside the heat conduction plate to be transmitted to the resin heat radiation plates, and then, the transmitted heat is radiated to outside air from the resin heat radiation plates.

A lighting apparatus according to a second aspect is featured in that the heat conduction plate is made of aluminum in the first aspect.

Incidentally, the LED substrate unit means a part obtained by unifying an LED chip mounted on a substrate and the substrate.

Effects of the Invention

According to the first and second aspects, since the metallic heat conduction plate having the LED substrate unit mounted thereon is covered at both surfaces thereof with the resin heat radiation plates, the heat generated at the time of light emission of the LED can be quickly diffused by the heat conduction plate, and further, the diffused heat can be radiated via the heat radiation plates. The heat radiation plates are made of the resin having the high thermal emittance, thereby producing the sufficient heat dissipation effect accordingly. The heat dissipation effect is high in this manner, thus enhancing the durability of the LED.

In addition, since the heat conduction plate is covered at both surfaces thereof with the resin heat radiation plates having a low heat conductivity, there is no unpleasant feeling caused by the heat even if a person directly touches the apparatus.

Moreover, since the LED substrate unit is mounted on the heat conduction plate, the LED can be placed at an arbitrary position on the heat conduction plate without using a customized aluminum packaged substrate, thereby maintaining the characteristics as the lighting apparatus. As a result, no cost is added, unlike in the related art in which an electric circuit is designed on an aluminum plate according to the shape of a casing or the arrangement of an LED.

Additionally, the heat conduction plate and the heat radiation plates are made of plate members in the three-layered structure, making it possible to increase or decrease the entire thickness. In this manner, since the entire thickness can be freely determined, the freedom of design also is improved. In particular, each of the plates only needs to have the function of heat conduction or radiation, and therefore, the thickness of the plates can be reduced to an absolute minimum. For example, when the lighting apparatus is applied to a desk lamp, a totally new super thin type having an original design, which has not been observed in the related art, can be obtained.

When the thickness of the lighting apparatus is reduced to an absolute minimum, the weight thereof can be reduced. If the lighting apparatus having the reduced weight according to the present invention is applied to a desk lamp, a base part can be stably located even if it is made small. In this manner, the weight can be reduced, and further, the base part can be reduced in size, thereby enhancing packaging efficiency and transportation efficiency.

In addition, when the lighting apparatus is of a pendant type hanging from the ceiling, the weight reduction leads to the safety.

Additionally, the heat conduction plate is covered at both surfaces thereof with the resin heat radiation plates, so that the three-layered structure of the heat conduction plate and the heat radiation plates is not warped by the function of the heat. For example, if the heat conduction plate is covered at only one surface thereof with the resin heat radiation plate, the structure may be warped due to the difference in expansion coefficient between the plates. However, when the heat conduction plate is covered at both surfaces thereof with the resin heat radiation plates to constitute the three-layered structure as described above, the heat conduction plate is sandwiched between the heat radiation plates having the same expansion coefficient. Therefore, even the action of the heat does not warp the structure.

In the meantime, when the lighting apparatus is reduced in thickness as described above, the plate-like apparatus is often gripped by fingers. However, since the heat conduction plate is covered at both surfaces thereof with the resin heat radiation plates as described above, there is no unpleasant feeling caused by the heat even if the apparatus is gripped by fingers.

According to the second aspect, the lighting apparatus as a whole can be reduced in weight.

Best Mode for Carrying out the Invention

FIG. 1 is a cross-sectional view showing a lighting apparatus according to an embodiment of the present invention.

In the present embodiment, an LED substrate unit 1 is mounted on a heat conduction plate 3 made of aluminum, and heat radiation plates 4 and 5 made of an ABS resin (an acrylonitrile-butadiene-styrene copolymer) are respectively brought into close contact with entire both surfaces of the heat conduction plate 3 except a portion where the LED substrate unit 1 is attached. In this manner, the heat radiation plates 4 and 5 and the heat conduction plate 3 constitute a three-layered structure. Here, an opening 6 corresponding to the portion where the LED substrate unit 1 is attached is formed at the heat radiation plate 5 on the surface of the heat conduction plate 3 where the LED substrate unit 1 is attached.

Incidentally, the LED substrate unit 1 is a commercially available part obtained by unifying an LED chip 2 mounted on a substrate and the substrate.

The aluminum constituting the heat conduction plate 3 is a highly conductive metal having a conductivity of 230 [W/(m·K)] and a thermal emittance of 0.05. In contrast, the ABS resin constituting the heat radiation plates 4 and 5 has a heat conductivity of 0.1 to 0.18 [W/(m·K)] and a thermal emittance of 0.6 to 0.9. It is found that the ABS resin is lower in heat conductivity but much higher in thermal emittance than aluminum.

In other words, the heat radiation plates 4 and 5 made of the resin having the low heat conductivity and the high thermal emittance are brought into close contact with the exposed portions of the heat conduction plate 3 having the high heat conductivity.

In the lighting apparatus of the present embodiment, the LED substrate unit 1 is brought into close contact with the aluminum heat conduction plate 3 having the high heat conductivity. Therefore, although heat is generated when the LED 2 emits light, the heat is diffused from the LED substrate unit 1 to the inside of the aluminum heat conduction plate 3, to be quickly transmitted to the heat radiation plates 4 and 5.

The heat quickly transmitted to the inside of the heat conduction plate 3 reaches the contact surfaces between the heat conduction plate 3 and the heat radiation plates 4 and 5, and is then radiated to outside air from the surfaces of the heat radiation plates 4 and 5.

That is, it is considered that the both surfaces of the heat conduction plate 3 are covered with the heat radiation plates 4 and 5, and therefore, the heat quickly diffused in the heat conduction plate 3 can be efficiently transmitted to the heat radiation plates 4 and 5 from the surfaces of the heat conduction plate 3. In this manner, the quick transmission of the heat to the heat radiation plates 4 and 5 more utilizes the high thermal emittance of the heat radiation plates 4 and 5, thus achieving efficient heat dissipation.

As a result, the heat conduction plate 3 having the high heat conductivity and covered with the heat radiation plates 4 and 5 having the high thermal emittance is remarkably enhanced in heat dissipation capacity as a whole, so that the LED substrate unit 1 can be kept at an initial low temperature.

In the present embodiment, the LED substrate unit 1 can be kept at a lower temperature than the conventional ones, and therefore, the light from the LED can be efficiently exchanged, and further, the lifetime of the LED can be prolonged.

As described above, the heat radiation plates 4 and 5 are low in heat conductivity, and therefore, even if a hand touches the surfaces covered with the heat radiation plates 4 and 5, a burn as well as an unpleasant hot feeling is prevented. This is because although the temperature at the contact portion is instantaneously decreased since the heat at the portion where the hand touches is taken by the hand or the like, the heat cannot be immediately transmitted to the contact portion, unlike a touch on the conventional metallic casing.

Consequently, the lighting apparatus in the present embodiment can be safely installed even at a position where a person possibly touches the apparatus.

In this manner, the surfaces of the resin heat radiation plates 4 and 5 give a less danger of a burn or an unpleasant feeling in comparison with the metallic member which has the same temperature in an initial state. Therefore, the LED substrate unit 1 can be set at high temperature even in consideration of heat countermeasures. In other words, a current to be supplied to the LED is increased so as to enhance the brightness of illumination.

Moreover, in the present embodiment, the efficient heat dissipation is achieved only by the heat conduction plate 3 and the resin heat radiation plates 4 and 5 covering the surfaces of the heat conduction plate 3. In other words, it is not necessary to dispose either a heat radiation fin or fan or a large cover for preventing any touch by a hand in the lighting apparatus of the present embodiment, thus achieving the miniaturization of the lighting apparatus with safety, and further, enhancing the ease of use.

If the lighting apparatus shown in FIG. 1 can be miniaturized, the freedom degree of design of an apparatus as a whole incorporating the lighting apparatus can be enhanced, thereby enhancing design performance.

Both the surfaces of the heat conduction plate 3 are covered with the resin heat radiation plates 4 and 5 in the lighting apparatus of the present embodiment, so that the heat cannot bend the plate members even if there is a difference in heat expansion coefficient between the aluminum constituting the heat conduction plate 3 and the ABS resin constituting the heat radiation plates 4 and 5. For example, when the heat radiation plate made of the ABS resin is disposed on only one surface of the aluminum heat conduction plate 3, the structure may possibly warp due to the difference in expansion coefficient between the plates. However, both the surfaces of the heat conduction plate 3 are covered with the resin heat radiation plates 4 and 5 in the three-layered structure as described above. In this manner, the heat conduction plate is sandwiched between the heat radiation plates having the same expansion coefficient, and therefore, the plates cannot be warped even if the heat acts thereon. Consequently, each of the plate members can be decreased in thickness, thus obtaining the super thin lighting apparatus.

For example, in the lighting apparatus of the present embodiment, when the thickness of each of the heat conduction plate 3 and the heat radiation plates 4 and 5 is set to 2 [mm], that is, the total thickness to 6 [mm], and the LED substrate unit 1 on which an LED of 10 [W] is mounted is used, the illuminance becomes 2000 [1x] at a radiation distance of 40 [cm] from a light source. That is, it is confirmed that a sufficient heat dissipation capacity can be maintained. The above-described illuminance is enough for precise work.

Incidentally, in order to achieve the illuminance, a plurality of LED substrate units 1 may be mounted on the heat conduction plate 3, so as to achieve required intensity. Alternatively, an LED substrate unit 1 having a plurality of LEDs 2 mounted thereon may be used.

As described above, the lighting apparatus in the present embodiment can smoothly dissipate the heat generated by the light emission from the LED while achieving the sufficient brightness despite the small thickness as described above.

In particular, although the position of a light source may be adjusted by picking up both surfaces of the lighting apparatus by fingers in the case of the above-described super thin lighting apparatus of a stand type, it is possible to prevent any unpleasant hot feeling or any burn in such a case.

Moreover, the heat conduction plate 3 for quickly transmitting the heat generated in the LED 2 to the heat radiation plates 4 and 5 is independent from the LED substrate unit 1 in the lighting apparatus of the present embodiment. As a result, it is not necessary to take the electric characteristics of the heat conduction plate 3 into consideration. The LED 2 can be freely arranged by mounting the LED unit 1 on the heat conduction plate 3.

In particular, the LED is high in light straightness, and therefore, the arrangement varies the brightness at the irradiation surface or shades. Therefore, the arrangement of the plurality of LEDs 2 is important for the lighting apparatus. It is easy to change the arrangement of the LEDs 2 in the lighting apparatus of the present embodiment.

Incidentally, the opening 6 is formed at the heat radiation plate 5 on the side where the LED substrate unit 1 is mounted in the heat conduction plate 3, and therefore, the contact area with the heat conduction plate 3 is smaller than the heat radiation plate 4 on the opposite side. In other words, the difference in contact area is produced between the heat radiation plates 4 and 5 in contact with both surfaces of the heat conduction plate 3. When the difference is smaller, it is possible to prevent the three-layered structure from warping due to a difference in heat expansion. Here, in the case where the area of the opening formed in the heat radiation plate 5 increases by disposing many LED substrate units 1, the thickness of the heat radiation plate 5 is increased more than that of the heat radiation plate 4, so that a balance needs to be taken between the heat radiation plate 5 and the heat radiation plate 4 disposed on the opposite side.

In the embodiment shown in FIG. 1, the resin heat radiation plates 4 and 5 mounted on both surfaces of the heat conduction plate 3 mate with the heat conduction plate 3 on the peripheries. However, the periphery of each of the heat radiation plates 4 and 5 may project outward of the periphery of the heat conduction plate 3 by enlarging the heat radiation plates 4 and 5 more than the heat conduction plate 3 as shown in FIG. 2, as long as the heat radiation plates 4 and 5 are brought into close contact with the exposed surfaces of the heat conduction plate 3. Here, the projection amount from the periphery of the heat conduction plate 3 need not be the same in the heat radiation plates 4 and 5, and only one of the heat radiation plates 4 and 5 may project outward of the periphery of the heat conduction plate 3. Alternatively, the end surface of the heat conduction plate 3 may be covered with the heat radiation plate 4 or 5.

Additionally, although the lighting apparatus of the present embodiment has the shape to be applied to an apparatus of a stand type, the lighting apparatus according to the present invention may be applied to an apparatus of a pendant type. Also in this case, the small-sized and light-weight lighting apparatus having a high heat dissipation efficiency, a high brightness, and a long lifetime can be obtained while making full use of an excellent very thin design. In addition, there is no unpleasant feeling caused by the heat upon touch by a hand, and therefore, the apparatus can be used at a low position where a hand may possibly touch the apparatus. In particular, in the case of the pendant type, there is an additional merit that the weight reduction enhances safety.

Incidentally, although the heat conduction plate is made of aluminum in the embodiment according to the present invention, the material for the heat conduction plate is not limited to aluminum. Any normal metal satisfies the function of the heat conduction plate. For example, copper has a heat conductivity of 420 [W/m·K] which is higher than that of aluminum, and further, other metals have a high heat conductivity in comparison with normal resins.

However, when the heat conduction plate is made of aluminum, the weight can be more reduced. A lighting apparatus excellent in design can be obtained by achieving both of the small size and the weight reduction.

Moreover, the material constituting the heat radiation plates 4 and 5 is not limited to the ABS resin in the above-described embodiment, and general resins having a low heat conductivity and a high thermal emittance such as acrylic, polypropylene, polystyrene, and an acrylonitrile-styrene copolymer may be used.

The heat radiation plates 4 and 5 may be made of different materials which are approximate to each other in heat expansion coefficient.

Figure 1:
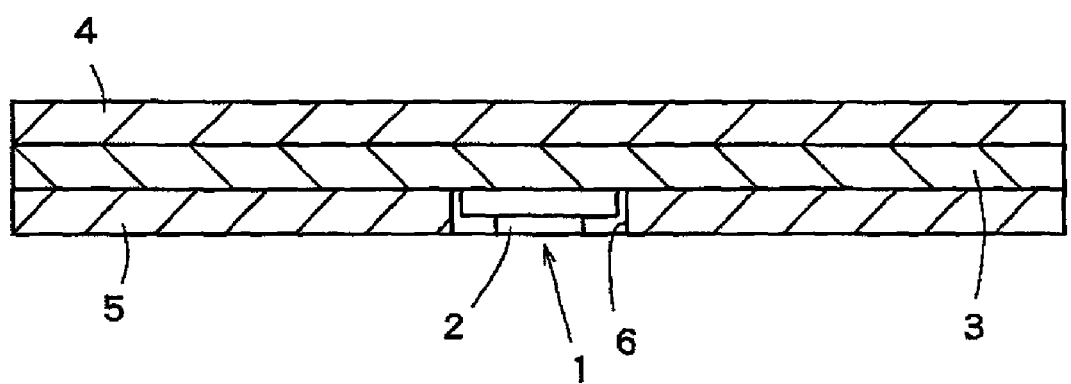
FIG. 1 is a cross-sectional view of an embodiment.
Figure 2:
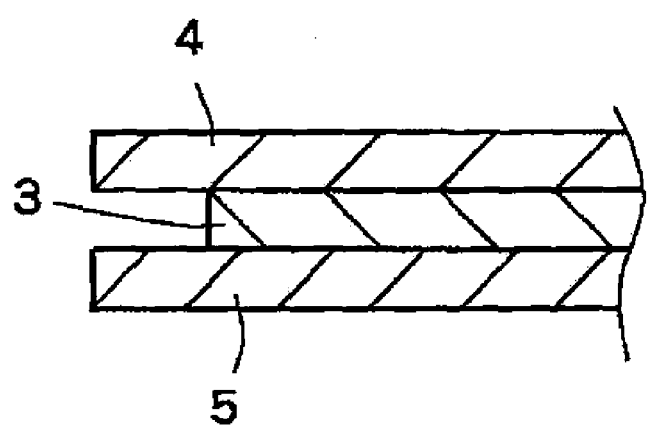
FIG. 2 is a partial cross-sectional view of another embodiment.
Explanation of Reference Numerals
1 LED substrate unit
2 LED
3 (metallic) heat conduction plate
4, 5 (resin) heat radiation plate

The invention claimed is:

1. A lighting apparatus having a three-layered structure including a metallic heat conduction plate having a high heat conductivity and including an LED substrate unit attached thereto, and resin heat radiation plates having a high thermal emittance in the range of between about 0.6 to 0.9 and a low heat conductivity in the range of between about 0.1 to 0.18 W/mK and brought into situated in close contact with respective surfaces of the heat conduction plate and over the exposed surfaces thereof except a portion where the LED substrate unit is attached, wherein heat radiated from the LED substrate unit is diffused inside the heat conduction plate to be transmitted to the resin heat radiation plates, and then, the transmitted heat is radiated to outside air from the resin heat radiation plates.

2. The lighting apparatus according to claim 1 wherein the heat conduction plate is made entirely of a metallic material.

3. The lighting apparatus according to claim 2, wherein the heat conduction plate is made entirely of aluminum.

4. The lighting apparatus according to claim 1 wherein the heat conduction plate has a heat conductivity equal to or greater than about 230 W/mK.

* * * * *